(12) United States Patent
Oprysko et al.

(10) Patent No.: US 6,940,165 B2
(45) Date of Patent: Sep. 6, 2005

(54) IMPEDANCE MATCHED ELECTRICAL INTERCONNECT USING DIELECTRIC COMPOUNDS

(75) Inventors: Modest M. Oprysko, Carmel, NY (US); Lei Shan, Yorktown Heights, NY (US); Jeannine M. Trewhella, Peekskill, NY (US)

(73) Assignee: International Business Machines Corporation, Armonk, NY (US)

( * ) Notice: Subject to any disclaimer, the term of this patent is extended or adjusted under 35 U.S.C. 154(b) by 134 days.

(21) Appl. No.: 10/241,403

(22) Filed: Sep. 11, 2002

(65) Prior Publication Data

US 2004/0046235 A1 Mar. 11, 2004

(51) Int. Cl.[7] ............................................... H01L 23/48
(52) U.S. Cl. ..................................................... 257/734
(58) Field of Search ................................. 257/734, 735, 257/736, 737, 738, 779, 780, 781, 783–784, 785, 669, 701, 702, 666, 678, 691, 668, 672, 673, 676, 698, 684, 690, 692, 704, 707, 664

(56) References Cited

U.S. PATENT DOCUMENTS 5,904,497 A * 5/1999 Akram
6,084,295 A * 7/2000 Horiuchi et al.
6,329,709 B1  12/2001 Moden et al.

* cited by examiner

Primary Examiner—Nathan J. Flynn
Assistant Examiner—Kevin Quinto
(74) Attorney, Agent, or Firm—Ryan, Mason & Lewis, LLP

(57) ABSTRACT

An improved electrical interconnect is formed wherein a dielectric material having a controllable characteristic is applied to at least a portion of the interconnect. The controllable characteristic of the dielectric material is selectively adjustable so that the impedance of the electrical interconnect is substantially matched to at least one impedance at first and second ends of the interconnect. In this manner, an electrical discontinuity between the first and second ends of the electrical interconnect is reduced, thereby improving an electrical performance of the interconnect.

18 Claims, 4 Drawing Sheets

INSERTION LOSS WITH/WITHOUT DIELECTRIC MATERIALS

IMPEDANCE MATCHED ELECTRICAL INTERCONNECT USING DIELECTRIC COMPOUNDS

FIELD OF THE INVENTION

The present invention relates generally to electrical interconnections, and more particularly relates to techniques for controlling an impedance of an electrical interconnect, particularly in an integrated circuit (IC) device.

BACKGROUND OF THE INVENTION

Conventional IC devices generally include a semiconductor die having a plurality of bond pads thereon, a leadframe mechanically connected to the die, and bond wires which electrically couple the bond pads of the die with pins on the leadframe. The semiconductor die, bond wires and at least a portion of the leadframe are then surrounded with an encapsulation material, such as plastic, to help ensure the structural rigidity of the IC device.

With the continual push to increase the operating frequency of electronic devices, electrical interconnects, comprising, for example, wire/ribbon bonds, leadframe pins, etc., become a primary bottleneck in the electrical performance of a semiconductor device. This degradation in electrical performance of the device can be attributed, at least in part, to discontinuities and/or parasitic impedances (e.g., inductance) that may be present in the device itself, or in the interconnection of the device with a printed circuit board (PCB) to which the pins of the device are often soldered. For example, the signal path provided by a conventional IC package may have a relatively high inductance associated therewith, which can undesirably affect signal integrity through the IC device. The degradation of signal integrity becomes particularly unacceptable at high operating frequencies (e.g., 10 gigahertz (GHz) and above).

There exists a need, therefore, for improved electrical interconnection techniques which will eliminate or reduce the above-stated problems.

SUMMARY OF THE INVENTION

The present invention provides techniques for controlling an impedance of electrical interconnects associated with an IC device (or alternative interconnect structure) and eliminating or reducing electromagnetic wave propagation discontinuities, thereby improving the electrical performance of the IC device, especially at very high operating frequencies (e.g., 10 GHz and above). The invention involves the use of dielectric compounds placed on one or more electrical interconnects associated, for example, with the IC package. The interconnects can be wire/ribbon bonds, leadframe pins, etc., which tend to introduce discontinuities and parasitic inductance that can degrade the electrical performance of the packaged IC device.

In accordance with one aspect of the invention, an improved electrical interconnect is formed wherein a dielectric material having a controllable characteristic is applied to at least a portion of the interconnect. An impedance associated with the electrical interconnect is affected, at least in part, by the controllable characteristic of the dielectric material. The controllable characteristic is selectively adjustable so that the impedance of the electrical interconnect is substantially matched to at least one impedance at first and second ends of the interconnect. In this manner, an electrical discontinuity between the first and second ends of the interconnect is reduced, thereby improving an electrical performance of the interconnect.

In a preferred embodiment of the invention, the dielectric material applied to the electrical interconnect comprises a polymeric carrier impregnated with dielectric particles, such that the dielectric constant of the material may be controlled by varying the particle material and/or loading percentage. The mechanical properties of the dielectric material, such as, for example, an elastic modulus, may also be varied by using different polymeric carriers to release thermal stress.

In accordance with another aspect of the invention, a method for forming an electrical interconnect includes the steps of: (i) determining respective impedances at first and second ends of the electrical interconnect; and (ii) applying a dielectric material to at least a portion of the electrical interconnect, the dielectric material having a controllable characteristic associated therewith, the controllable characteristic being selectively adjustable so that an impedance of the electrical interconnect is substantially matched to at least one of the respective impedances at the first and second ends of the electrical interconnect.

These and other objects, features and advantages of the present invention will become apparent from the following detailed description of illustrative embodiments thereof, which is to be read in connection with the accompanying drawings.

DETAILED DESCRIPTION OF PREFERRED EMBODIMENTS

The present invention, which relates to improved electrical interconnects, will be described herein in the context of an IC device. It is to be appreciated, however, that the techniques of the present invention are not limited to IC devices. Rather, the techniques of the invention may be generally employed for tuning an impedance associated with an electrical interconnect such that the impedance of the interconnect is substantially matched to at least one impedance at respective ends of the interconnect. Moreover, the techniques of the present invention may be utilized, for example, with a flexible circuit manufacturing process. In this manner, undesirable effects due, at least in part, to discontinuities and/or parasitic inductances associated with the interconnect can be minimized.

As previously stated, the present invention provides techniques for controlling an impedance of electrical interconnects associated with an IC device, or alternative interconnect structure, so as to eliminate or reduce electromagnetic wave propagation discontinuities through the interconnects, thereby improving the overall electrical performance of the device, especially at very high operating frequencies (e.g., 10 GHz and above). The interconnects may be, for example, wire/ribbon bonds, leadframe pins, etc., which tend to introduce discontinuities and/or parasitic inductances and thereby degrade packaging performance.

In accordance with one aspect of the invention, a dielectric material or compound is applied to at least a portion of one or more electrical interconnects associated with the IC device so as to operatively adjust or "tune" the impedance of the one or more interconnects to advantageously minimize the effects of the above-noted discontinuities and/or parasitic inductances. The dielectric material is preferably applied in a desired region or regions of the IC device, after a bonding process has been completed. Accordingly, the invention is fully compatible with conventional IC interconnect methodologies.

By applying a predetermined dielectric material to a bond/lead structure (e.g., S, SS, GSG, GSSG, etc., where S represents a wire carrying an alternating current (AC) signal and G represents a wire carrying an AC ground, e.g., a direct current (DC) or ground potential, respectively), the impedance of a given electrical interconnect can be controlled to be substantially equal to the characteristic impedance of a transmission line at both ends of the interconnect, so that the discontinuity is essentially eliminated, or at least significantly reduced, and the electrical performance of the interconnect is substantially improved. As will be understood by those skilled in the art, transmission line theory can be used to characterize the behavior of an electrical interconnect, which can be modeled using, for example, lumped parameters.

The characteristic impedance of a transmission line may be defined as:

$$Z_O = \sqrt{\frac{R + jwL}{G + jwC}}$$

where $Z_O$ represents the impedance of the transmission line, R is the resistance of the transmission line, L is the inductance of the transmission line, G is the conductance of the transmission line, and C is the coupling capacitance of the transmission. For a given interconnect structure, by adding the dielectric material, the coupling capacitance C may be increased until the desired impedance is obtained. Since the application of the dielectric material may also slightly affect other parameters of the transmission line, such as, for example, the resistance R, inductance L, and/or conductance G, a series fine tuning process (e.g., by simulation) may be required to obtain the desired impedance.

Figure 1:
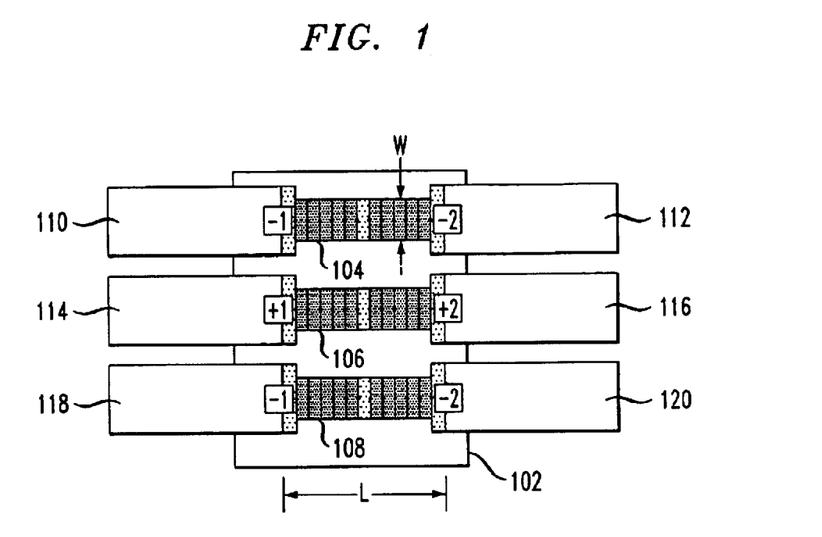
FIG. 1 is a top plan view illustrating at least a portion of a ribbon bond interconnect, formed in accordance with one aspect of the present invention.

FIG. 1 illustrates an exemplary ground-signal-ground (GSG) ribbon bond structure 102, as may be utilized, for example, in an IC chip bonding process, including a plurality of interconnects 104, 106 and 108. The exemplary ribbon bond structure 102 includes a finite ground plane coplanar (FGC) waveguide 110, 112, 114, 116, 118 and 120 at both ends of a corresponding interconnect 104, 106 and 108, respectively. Typically, the FCG waveguides at both ends of a given interconnect have fixed impedances that are matched to one another. An impedance discontinuity generally occurs at the junctions at both ends of the interconnect. The FGC waveguides in the illustrative ribbon bond structure 102 preferably have an impedance of about 50 ohms, as is typically used.

Each interconnect 104, 106, 108 in the ribbon bond structure 102 may be formed having a width W of about 75 microns, a length L of about 300 microns, and a height (thickness) of about 75 microns. A change in one or more of these dimensions can directly affect an insertion loss and a return loss associated with the interconnect. For example, both insertion and return losses of the interconnect would be much larger if narrower (i.e., decreased W), longer (i.e., increased L), and/or higher (i.e., thicker) interconnects are used, which is often the case on a production line.

Figure 2:
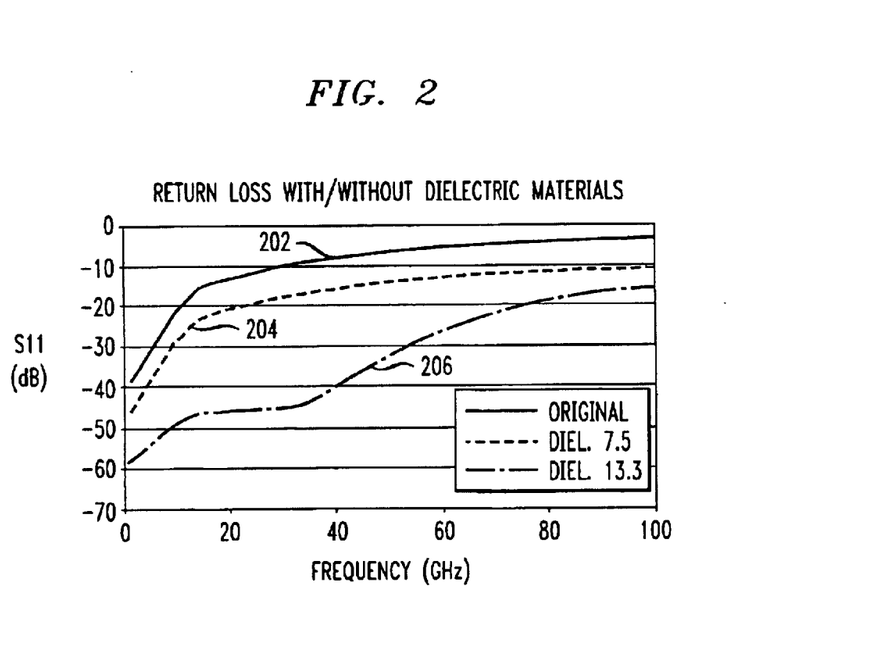
FIG. 2 is a graphical representation depicting a comparison of return loss associated with the exemplary interconnection of FIG. 1, with and without application of the dielectric material of the present invention.
Figure 3:
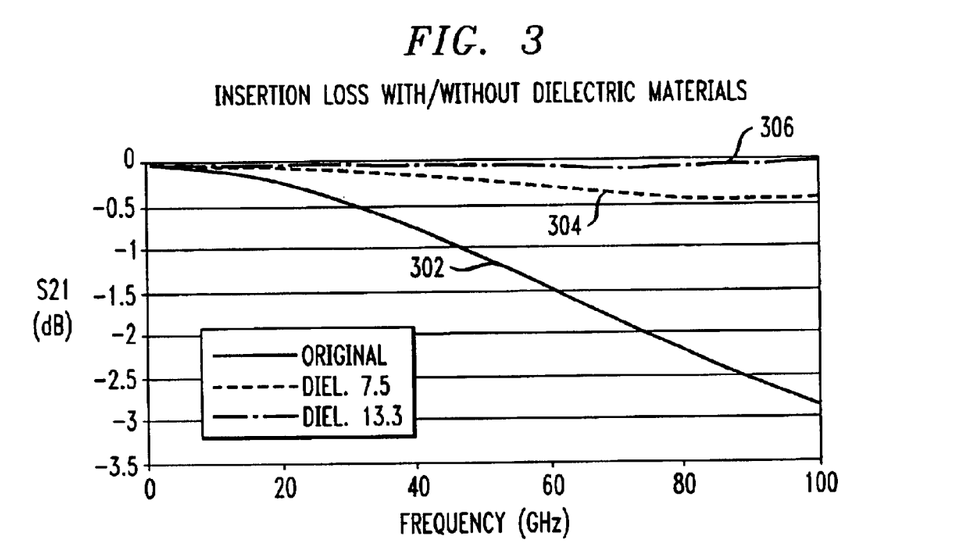
FIG. 3 is a graphical representation depicting a comparison of insertion loss associated with the exemplary interconnection of FIG. 1, with and without application of the dielectric material of the present invention.

By way of example only, FIG. 2 illustrates a graph of return loss (in decibels (dB)) of the interconnect verses frequency. The return loss, which is a measure of the energy loss of a signal due to reflection as it travels through the interconnect, corresponding to the exemplary interconnect described above is shown as graph line 202. Similarly, FIG. 3 illustrates a graph of insertion loss (in dB) of the interconnect verses frequency. The insertion loss, which is a measure of signal attenuation attributable to the insertion of the interconnect in the system (primarily due to impedance mismatches and discontinuities), corresponding to the exemplary interconnect is shown as graph line 302. As apparent from the figures, return loss approaches about −15 dB, which is widely used as an acceptable design limit, at about 15 GHz, and insertion loss is about −0.2 dB at this frequency. The insertion loss of the interconnect increases significantly as the frequency increases, approaching about −2.8 dB at about 100 GHz. A similar trend can also be observed in a leadframe structure. The additional signal losses due to leadframe pins and/or wire/ribbon bonds helps explain the reason why most conventional IC packages with wire/ribbon bonds and/or leadframes are limited to operate under about 10 GHz.

As explained above, the present invention provides techniques for tuning the impedance of the interconnect by applying a dielectric material to at least a portion of the interconnect, preferably the wire/ribbon bond structure. The addition of the dielectric material to the interconnect increases the amount of parasitic capacitance associated with the interconnect. Consequently, by controlling this capacitance, the impedance of the interconnect can be adjusted to match the impedance at both ends of the interconnect as desired. The type of compound used for the dielectric material, the loading percentage, the thickness of the dielectric material, and/or the location of the dielectric material on the interconnect are among some of the controllable characteristics associated with the dielectric material. By selectively varying one or more of these controllable characteristics of the dielectric material, the parasitic capacitance, and thus the overall impedance, of the interconnect can be tuned, in accordance with the present invention.

Virtually any dielectric material can be used with the present invention to improve the electrical performance of a given interconnect. Preferably, the dielectric material is formed of a compound comprising a polymeric carrier impregnated with dielectric particles (e.g., a dielectric powder). Suitable materials which may be employed with the present invention include those compounds listed in Table 1 below, although alternative materials may also be utilized and are similarly contemplated.

TABLE 1

| Polymeric Carrier | Dielectric Constant | Loss Factor | Modulus (MPa) | CTE (ppm/C) | Shrinkage (ppm) |
|---|---|---|---|---|---|
| Epoxy | 3.7 | 0.003 | 2600 | 100 | 5000 |
| Silicone | 3.2 | 0.009 | 0.1–1 | 350 | 3000 |

| Dielectric Powder | Dielectric Constant | Suitable Dielectric Constant Range of the Compound |
|---|---|---|
| $Al_2O_3$ | 9.6 | 4–8 |
| $SrTiO_3$ | 300 | 8–20 |
| $BTiO_3$ | 5000 | >20 |

The particle size of the dielectric powder can be anywhere from about 10 nanometers (nm) to about 10 micrometers (μm). Generally, the smaller the particle size, the larger a maximum particle volume fraction (i.e., loading percentage or loading capacity) associated with the dielectric powder. Moreover, using a smaller particle size typically provides better compound stability. In some instances, a multi-modal (i.e., more than two particle sizes) powder may be used for maximum particle addition. With an increase in the particle volume fraction, a viscosity and modulus of the compound tends to increase, while a coefficient of thermal expansion (CTE) and shrinkage of the compound tend to decrease. Many critical properties of the compound, such as, for example, mechanical integrity and adhesion strength, will undesirably suffer once the particle volume fraction exceeds a predetermined percentage. In most cases, a particle volume fraction of up to about 70 percent (%) can be used, although a much lower percentage (e.g., less than about 40%) is preferred for wire/ribbon bond applications because of the low stress requirement.

As will be understood by those skilled in the art, the dielectric constant can be defined as a measure of the ability of a substance to attenuate the transmission of an electrical force from one charged body to another. The lower the value, the greater the attenuation. The dielectric constant of a compound may be determined using Looyenga's formula:

$$\epsilon = [\epsilon_1^{1/3} + v_2(\epsilon_2^{1/3} - \epsilon_1^{1/3})]^3$$

where, $\epsilon_2$ and $v_2$ are the dielectric constant and volume fraction, respectively, of the dielectric powder, and $\epsilon_1$ is the dielectric constant of the polymeric carrier. As an example, a dielectric compound having a dielectric constant $\epsilon=7.5$ can be obtained by adding 70% aluminum oxide ($Al_2O_3$) powder into a silicone carrier, and a dielectric compound having a dielectric constant $\epsilon=13.3$ can be obtained by adding 5% strontium titanate ($SrTiO_3$) powder into a silicone carrier.

In general, the dielectric compound may be integrated with conventional manufacturing methodologies, such as, for example, injection/transfer molding and glob top encapsulation. For transfer molding and glob top applications, according to the desired dielectric constant of the compound, any of the dielectric powders can be added to conventional transfer molding (typically epoxy-based) and glob top (typically either epoxy or silicone) materials to control the impedance of the signal leads passing through the material. For wire/ribbon bonds, leadframe pins, and other interconnects, a low modulus material, such as, for example, silicone, can be used as the polymeric carrier, and a low volume fraction of dielectric powder may be added to form a low viscosity and low modulus compound. Silicone is also known as a material achieving high reliability without hermeticity. Therefore, the use of silicone as a polymeric carrier will not only limit the stress caused by shrinkage and/or temperature elevation, but will also advantageously help resist moisture and mobile ions.

With continued reference to FIGS. 2 and 3, by way of example only, consider a dielectric material having a dielectric constant of 7.5 dispensed over the bonding region (e.g., fully emerge the ribbon bonds) of the interconnect. As shown by graph line 204 in FIG. 2, the −15 dB return loss point moves out to about 40 GHz (from about 15 GHz for the interconnect with no dielectric material applied), and the characteristic impedance of the bonding structure is reduced to about 63 ohms, compared with the 50-ohm transmission lines at each end of a bond. Additionally, the insertion loss of the interconnect is less than about −0.5 dB, even at 100 GHz, as shown by graph line 304 in FIG. 3. By further increasing the dielectric constant of the dielectric material to 13.3 applied to the wire/ribbon bond structure, the characteristic impedance is tuned to be substantially equal to 50 ohms, which is even more closely matched to the impedance of the transmission lines coupled to the interconnect. As shown by graph line 206 in FIG. 2, the return loss of the interconnect even at 100 GHz is less than −15 dB, and the insertion loss is negligible up to at least 100 GHz, as shown by graph line 306 in FIG. 3. Thus, in accordance with the techniques of the present invention, by applying a predetermined dielectric material to at least a portion of an interconnect so that the impedances at either ends of the interconnect are substantially matched, an ideal electrical performance may be achieved, even at frequencies of 100 GHz and beyond. Moreover, such techniques can be easily incorporated with conventional IC packaging methodologies.

Figure 4:
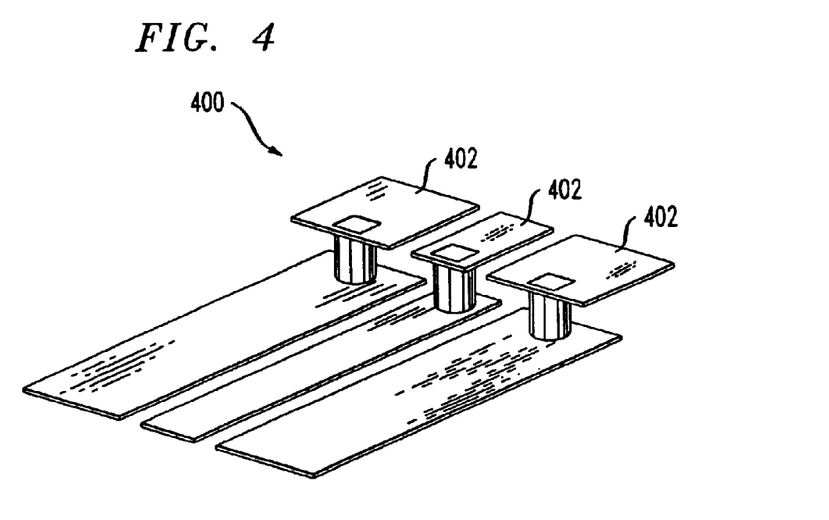
FIG. 4 is an illustration depicting an exemplary flip-chip interconnect, formed in accordance with another aspect of the present invention.

Wire/ribbon bond interconnects, to which the techniques of the invention may be directed, presently account for over 90% of the global electronic device yield, and there is still no known conventional solutions for these interconnect structures to operate at very high frequency (e.g., greater than 20 GHz). An alternative conventional solution has been to use a more expensive controlled collapse chip connection (C4) flip-chip interconnect in place of wire/ribbon bonds and leadframes. An illustrative C4 flip-chip interconnect 400, employing a coplanar waveguide (CPW) (e.g., CPW-C4-CPW package) is depicted in FIG. 4. However, the larger C4 pads 402 that are required tend to introduce additional parasitic capacitance that adversely degrades electrical performance. Additionally, an underfill material (not shown) is generally applied for reliability purposes, which tends to increase signal coupling (i.e., cross-talk) and change parasitic impedances on chip and on the printed circuit board to which the IC device is attached. The latter generally not only affects the electrical performance through the interconnect, but also complicates both the chip and board design. The C4 interconnect also introduces two discontinuity points that further degrade electrical performance.

Figure 5:
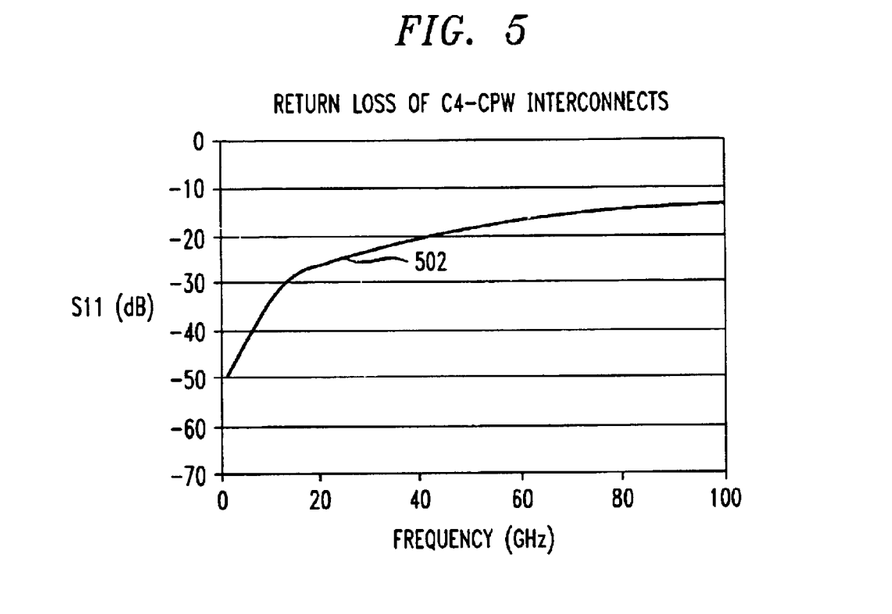
FIG. 5 is a graphical representation depicting a return loss associated with the exemplary interconnection of FIG. 4.
Figure 6:
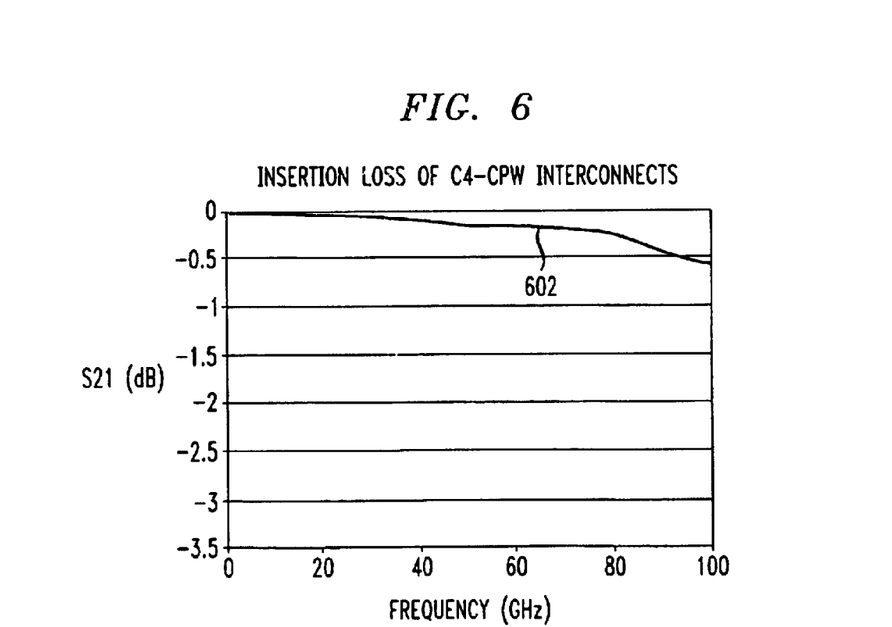
FIG. 6 is a is a graphical representation depicting an insertion loss associated with the exemplary interconnection of FIG. 4.

As a comparison, simulated return loss and insertion loss for the C4 interconnect are shown in FIGS. 5 and 6, respectively. As shown in FIG. 5, the C4 interconnect exhibits a return loss, as represented by graph line 502, of −15 dB at a frequency of about 70 GHz, which is better than a conventional ribbon bond interconnect. With reference to FIG. 6, the insertion loss of the C4 interconnect, as represented by graph line 602, is about −0.5 at a frequency of 90 GHz. However, in a comparison of the simulation results of the C4 interconnect and the ribbon bonds treated with $\epsilon=13.3$ dielectric material, as illustrated in FIGS. 2 and 3, the latter outperforms the C4 interconnect structure in terms of both insertion loss and return loss. Therefore, the techniques of the present invention advantageously enable the less expensive and easier designed conventional package to significantly outperform the more expensive and complex C4 package.

Figure 7:
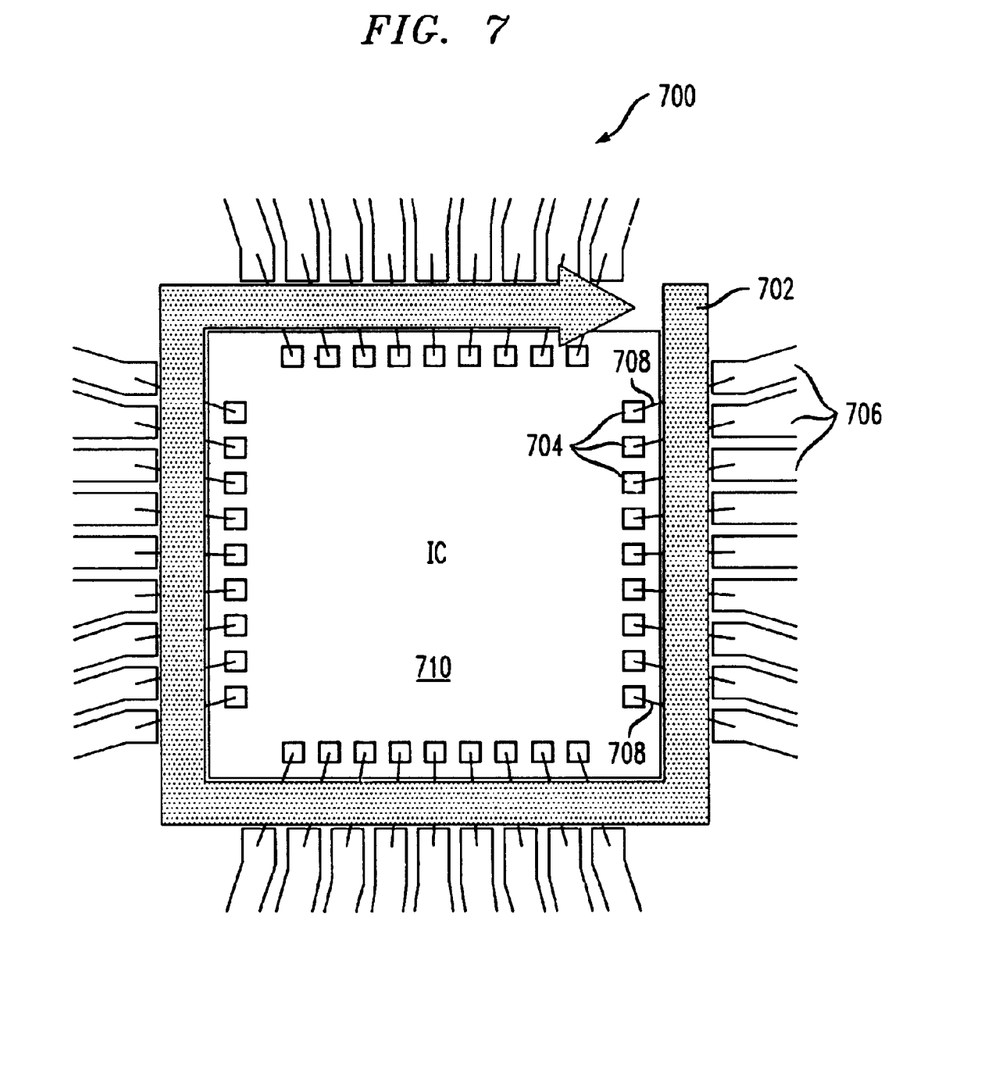
FIG. 7 is a top plan view illustrating a needle-dispensing process for applying the dielectric material to a plurality of interconnections, in accordance with the present invention.

In order to apply the above-described dielectric material in a desired location of the electrical interconnect, a needle-dispensing process can be used. FIG. 7 illustrates an exemplary IC device 700 including a semiconductor die 710 having a plurality of bond pads 704 thereon. The IC device 700 further includes a leadframe to which the semiconductor die 710 is physically attached. The leadframe has a plurality of pins 706 which are connected to corresponding bond pads 704 via wire/ribbon bonds 708. In the exemplary IC device 700, dielectric material 702 is applied over the wire/ribbon bonds (i.e., bonding region) 708.

As previously stated, for wire/ribbon bonds, the dielectric material 702 is preferably dispensed over the bonding region by a needle-dispensing process around a periphery of the leadframe. The needle width is preferably about the length of the bond wires, so that a single peripheral dispense is sufficient. Since the wire/ribbon bonds are relatively fragile, a low viscosity and low modulus compound is preferred for the dielectric material. In accordance with the invention, a similar method may be applied to the leadframe pins after the IC device is soldered. In this instance, the consistency of the dielectric material is preferably more rubber-like, so that it is able to be peeled off during a future rework process if required.

As previously stated, it is assumed that the impedances at both ends of the electrical interconnect are substantially the same with regard to one another. In accordance with another aspect of the invention, the dielectric material may be applied to the electrical interconnect so that an impedance across the interconnect is non-uniform. To accomplish this, the dielectric constant, or alternative characteristic, of the dielectric material may be selectively adjusted as it is applied to the interconnect, such as, for example, by varying the loading percentage and/or thickness of the material in a predetermined manner. Thus, the techniques of the present invention may be advantageously used for reducing discontinuities across the electrical interconnect even when the impedances at both ends of the interconnect are not the same.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. An integrated circuit (IC) device, comprising:
at least one electrical interconnect, the electrical interconnect having a first end and a second end; and
a dielectric material applied to at least a portion of the at least one electrical interconnect, the dielectric material having a controllable characteristic associated therewith, wherein the controllable characteristic of the dielectric material is selectively adjustable so that an impedance of the electrical interconnect is substantially matched to at least one impedance at the first and second ends of the interconnect;
wherein the dielectric material comprises a polymeric carrier impregnated with dielectric particles, such that a dielectric constant of the dielectric material is controllable by varying at least one of: (i) a material of the dielectric particles; and (ii) a loading percentage of the dielectric particles, the impedance of the at least one electrical interconnect being a function of the dielectric constant of the dielectric material.

2. The IC device of claim 1, wherein the loading percentage of the dielectric particles is less than about 70 percent.

3. The IC device of claim 1, wherein the polymeric carrier is selected from the group consisting of silicone and epoxy.

4. The IC device of claim 1, wherein the material of the dielectric particles is selected from the group consisting of aluminum oxide ($Al_2O_3$), strontium titanate ($SrTiO_3$) and boron titanate ($BTiO_3$).

5. The IC device of claim 1, wherein the controllable characteristic is a thickness of the dielectric material.

6. The IC device of claim 1, wherein a mechanical property of the dielectric material is controllable by varying a polymeric carrier material.

7. The IC device of claim 6, wherein the mechanical property of the dielectric material is an elastic modulus.

8. An integrated circuit (IC) device, comprising:
at least one electrical interconnect, the electrical interconnect having a first end and a second end; and
a dielectric material applied to at least a portion of the at least one electrical interconnect, the dielectric material having a controllable characteristic associated therewith, wherein the controllable characteristic of the dielectric material is selectively adjustable across a length of the electrical interconnect so that an impedance of the electrical interconnect is substantially matched to at least one impedance at the first and second ends of the interconnect;
wherein the controllable characteristic of the dielectric material is at least partially non-uniform between the first and second ends of the electrical interconnect, such that the impedance of the electrical interconnect is selectively variable across the interconnect.

9. An electrical interconnect, comprising:
at least one electrical conductor; and
a dielectric material applied to at least a portion of the at least one electrical conductor, the dielectric material having a controllable characteristic associated therewith, wherein the controllable characteristic of the dielectric material is selectively adjustable so that an impedance of the at least one electrical conductor is substantially matched to at least one impedance at first and second ends of the at least one electrical conductor;
wherein the dielectric material comprises a polymeric carrier impregnated with dielectric particles, such that a dielectric constant of the dielectric material is controllable by varying at least one of: (i) a material of the dielectric particles; and (ii) a loading percentage of the dielectric particles, the impedance of the at least one electrical interconnect being a function of the dielectric constant of the dielectric material.

10. The electrical interconnect of claim 9, wherein the loading percentage of the dielectric particle is less than about 70 percent.

11. The electrical interconnect of claim 9, wherein the polymeric carrier is selected from the group consisting of silicone and epoxy.

12. The electrical interconnect of claim 9, wherein the material of the dielectric particles is selected from the group consisting of aluminum oxide ($Al_2O_3$), strontium titanate ($SrTiO_3$) and boron titanate ($BTiO_3$).

13. The electrical interconnect of claim 9, wherein the controllable characteristic is a thickness of the dielectric material.

14. An electrical interconnect, comprising:

at least one electrical conductor; and a dielectric material applied to at least a portion of the at least one electrical conductor, the dielectric material having a controllable characteristic associated therewith, wherein the controllable characteristic of the dielectric material is selectively adjustable across a length of the electrical conductor so that an impedance of the at least one electrical conductor is substantially matched to at least one impedance at first and second ends of the at least one electrical conductor;

wherein the controllable characteristic of the dielectric material is at least partially non-uniform between the first and second ends of the at least one electrical conductor, such that the impedance of the at least one electrical conductor is selectively variable across the interconnect.

15. A method for forming an electrical interconnect, the method comprising the steps of:

determining impedances at first and second ends of the electrical interconnect; and applying a dielectric material to at least a portion of the electrical interconnect, the dielectric material having a controllable characteristic associated therewith, the controllable characteristic being selectively adjustable so that an impedance of the electrical interconnect is substantially matched to at least one of the respective impedances at the first and second ends of the interconnect;

wherein the dielectric material comprises a polymeric carrier impregnated with dielectric particles, such that a dielectric constant of the dielectric material is controllable by varying at least one of: (i) a material of the dielectric particles; and (ii) a loading percentage of the dielectric particles, the impedance of the at least one electrical interconnect being a function of the dielectric constant of the dielectric material.

16. The method of claim 15, wherein the step of applying the dielectric material is performed using a needle-dispensing process.

17. A method for forming an electrical interconnect, the method comprising the steps of:

determining impedances at first and second ends of the electrical interconnect;

applying a dielectric material to at least a portion of the electrical interconnect, the dielectric material having a controllable characteristic associated therewith, the controllable characteristic being selectively adjustable so that an impedance of the electrical interconnect is substantially matched to at least one of the respective impedances at the first and second ends of the interconnect; and selectively adding the dielectric material to an encapsulation material, whereby the dielectric material is applied to at least a portion of the electrical interconnect during encapsulation of the electrical interconnect.

18. A method for forming an electrical interconnect, the method comprising the steps of:

determining impedances at first and second ends of the electrical interconnect; and applying a dielectric material to at least a portion of the electrical interconnect, the dielectric material having a controllable characteristic associated therewith, the controllable characteristic being selectively adjustable across a length of the electrical interconnect so that an impedance of the electrical interconnect is substantially matched to at least one of the respective impedances at the first and second ends of the interconnect;

wherein the step of applying the dielectric material comprises the step of selectively varying the controllable characteristic of the dielectric material so that the impedance of the electrical interconnect is at least partially non-uniform across the electrical interconnect between the first and second ends of the interconnect.

* * * * *

UNITED STATES PATENT AND TRADEMARK OFFICE
CERTIFICATE OF CORRECTION

PATENT NO. : 6,940,165 B2
DATED : September 6, 2005
INVENTOR(S) : M.M. Oprysko et al.

It is certified that error appears in the above-identified patent and that said Letters Patent is hereby corrected as shown below:

<u>Title page,</u>
Item [75], Inventor, add -- Jiali Wu, Yorktown Heights, NY (US) --.

Signed and Sealed this

Thirtieth Day of May, 2006

JON W. DUDAS
*Director of the United States Patent and Trademark Office*